Oct. 16, 1962 G. J. KAHAN 3,058,851

METHOD OF FORMING SUPERCONDUCTIVE CIRCUITS

Filed March 30, 1960 2 Sheets-Sheet 1

INVENTOR
GEORGE J. KAHAN
BY Frederick J. Smyth
ATTORNEY

Oct. 16, 1962 G. J. KAHAN 3,058,851

METHOD OF FORMING SUPERCONDUCTIVE CIRCUITS

Filed March 30, 1960 2 Sheets-Sheet 2

3,058,851
Patented Oct. 16, 1962

3,058,851

METHOD OF FORMING SUPERCONDUCTIVE CIRCUITS

George J. Kahan, Port Washington, N.Y., assignor to International Business Machines Corporation, New York, N.Y., a corporation of New York Filed Mar. 30, 1960, Ser. No. 18,588
9 Claims. (Cl. 117—212)

This invention relates to a method of forming superconductive circuits and more particularly to an improved method of eliminating the edge contamination and thickness variation in evaporated thin films.

A simplified flow diagram is as follows:

| |
|---|
| Place evaporant charge in an evaporant source structure positioned within a vacuum chamber |
| Position substrate and pattern mask in alignment with the evaporant source structure |
| Evacuate chamber to evaporation pressure |
| Evaporate charge to obtain desired thin film geometry configuration |
| Etch film to improve the reproducibility of the electrical characteristics of the configuration without materially altering the geometry thereof |
| Anneal to further improve the electrical characteristics of the configuration (optional) |

The phenomenon of superconductivity, that is, the ability of certain materials to exhibit zero resistance to the flow of an electrical current when cooled to a sufficiently low temperature is employed in the design of various electrical circuits such as, by way of example, amplifiers, oscillators, and logical circuits. In general, each of these superconductive circuits employs a cryotron device. The cryotron may briefly be described as including a gate conductor, the conduction state of which, either superconducting or normal, is controlled by a control conductor. In an article by D. A. Buck which appeared in the Proceedings of the IRE, vol. 44, No. 4, April 1956, at pages 482 through 493, the cryotron is there described as consisting of a central cylindrical wire cooled to a superconductive temperature which functions as the gate conductor. Associated with the gate conductor is a single layer coil, generally fabricated of superconductive material, which functions as the control conductor. Current flow of at least a predetermined value through the control conductor generates a magnetic field which is effective to destroy superconductivity in the gate conductor, which then exhibits normal electrical resistance to current flow therethrough. In this manner, the cryotron provides a low cost, low power consuming, reliable circuit element.

In general, dynamic operation of superconductive circuits requires that a current flowing through one or more gate conductors be shifted, either partially or completely, through one or more other gate and/or control conductors. It has been shown in the above referenced article, that the time constant of this current shift is directly proportional to the circuit inductance and inversely proportional to the circuit resistance. Because of the relatively high inductance and low resistance exhibited by wire wound cryotrons, they are inherently a slow speed device.

Copending application Serial No. 625,512, filed November 30, 1956, on behalf of Richard L. Garwin and assigned to the assignee of this invention, discloses an improved cryotron type device which, while maintaining each of the advantages of wire wound cryotrons, additionally permits high speed operation. These cryotron type devices are fabricated of thin films of superconductive material, a first thin film functions as the gate conductor and a second thin film, insulated from the first, functions as the control conductor. High speed operation of these thin film cryotrons is possible since the circuit inductance can be reduced by several orders of magnitude, and, simultaneously, the circuit resistance can be increased by several orders of magnitude, if desired.

The film thickness of these thin film cryotrons is generally only about several thousand Angstrom units and for this reason superconductive circuits, either simple or complex, may advantageously be fabricated in quantity by the thermal evaporation of the necessary materials onto a substrate within an evacuated chamber. Vacuum deposition of materials has been employed in fabrication of a large number of articles, and a summary of the various techniques involved is contained in "Vacuum Deposition of Thin Films," by L. Holland, published by John Wiley and Sons, Inc., New York.

It has been found, however, that it is difficult to fabricate thin film superconductive circuits economically in quantity for the reason that the characteristics of thin film cryotrons, and more particularly the characteristics of thin film gate conductors, are generally not controllable and reproducible from cryotron to cryotron. This results primarily from the fact that thin film gate conductors do not always exhibit an abrupt and predetermined transition between the superconducting and resistive conduction state as a function of either the operating temperature or applied magnetic field.

In U.S. Patent 2,989,716, filed December 21, 1959, on behalf of Andrew E. Brennemann et al., and assigned to the assignee of this invention, there is disclosed a novel method of obtaining thin film gate conductors having controllable and reproducible characteristics with regard to the transition between conduction states which are fabricated by vacuum deposition. Briefly, the invention as disclosed in the above referenced copending application includes the steps of vacuum depositing a superconductive material onto a substrate wherein the area of deposition is determined by a pattern defining mask, then severing a portion of the edges of the deposit. Thin film gate conductors fabricated by the above method are characterized by a relatively sharp and controllable transition between conduction states, independent of whether or not a sharp transition was exhibited prior to the severing of the edges.

What has been discovered, as will be more particularly described in detail hereinafter, is an improved method of forming thin film cryotrons which is also effective to disassociate the edges of deposited films, to thereby obtain relatively sharp and reproducible transitions between conduction states. Further, the method of the invention can additionally be effective to surface polish the center portion of the film to thereby impart additional stability to the transition characteristics of thin film cryotrons by eliminating the possibility of surface impurities diffusing into the deposited thin film. Briefly, the method, according to the invention, comprises subjecting the thin film gate conductor to an etching operation, either chemically, electrolytically, or by electropolishing, to preferentially remove the edges of the film, and then further subjecting the film to an annealing operation. The etching operation is effective to remove the edges since, as has been pointed out in the hereinbefore reference U.S. Patent No. 2,989,716, the edges of deposited thin films, formed by the vacum deposition of material through a pattern defining mask onto a substrate, results in a concentration of impurities in the edges of the film and these impure edges are etched at a greater rate than the relatively homogeneous center portion of the film.

It is an object of the invention, therefore, to provide an improved method of fabricating superconductive circuits.

Another object of the invention is to provide an improved method of fabricating thin film superconductive gate conductors.

A further object of the invention is to provide an improved method of fabricating thin film cryotrons whose gate conductors have controllable and predetermined transition characteristics.

Yet another object of the invention is to provide an improved method of removing the edges of vacuum deposited thin film superconductive gate conductors.

A still further object of the invention is to provide an improved method of fabricating thin film superconductive gate conductors which exhibit relatively sharp and stabilized transitions between conduction states.

Still another object of the invention is to provide a method of etching a vacuum deposited film superconductive gate conductor to obtain a relatively abrupt transition between conduction states.

The foregoing and other objects, features and advantages of the invention will be apparent from the following more particular description of a preferred embodiment of the invention, as illustrated in the accompanying drawings.

In operating superconductive circuits, the required current shift is generally obtained by applying to selected gate conductors, a magnetic field of sufficient magnitude to switch the gate conductors from the superconducting to the resistive state. To attain the highest possible switching speed, it is desirable that the magnetic transition be relatively abrupt. It has been known that the sharpness of the magnetic transition of thin films is a function of both the film thickness and the film composition. More generally stated, a thin film having a uniform thickness and composition exhibits a relatively sharp magnetic transition. The temperature transition of thin films, however, is a function of the film composition only. For this reason, the temperature transition of the deposited film is discussed first in the following paragraphs, to illustrate the improvement in uniformity of composition afforded by the method of the invention. That the magnetic transition of thin films is also improved will then be shown.

Figure 1:
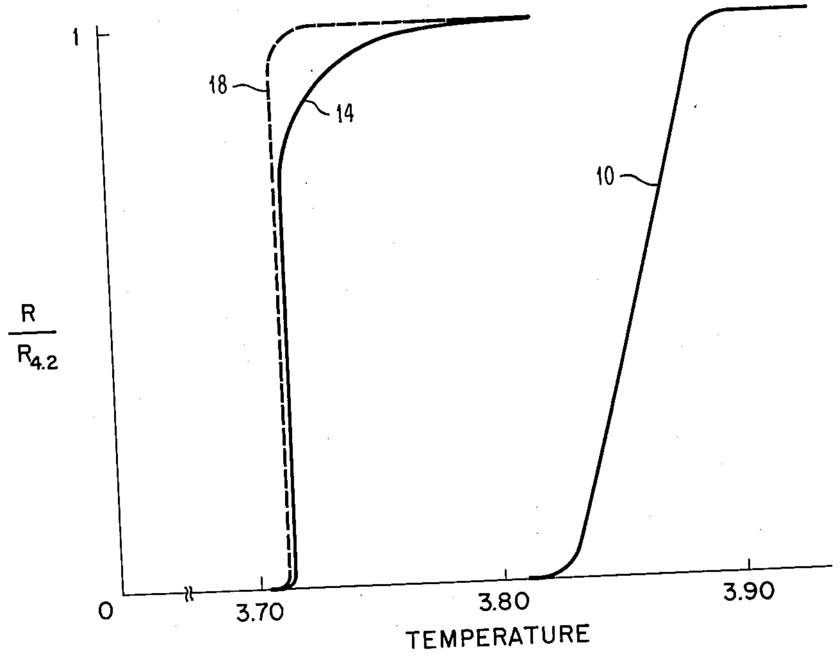
FIG. 1 illustrates the temperature transitions of thin film superconductive gate conductors carrying a first value of current.
Figure 2:
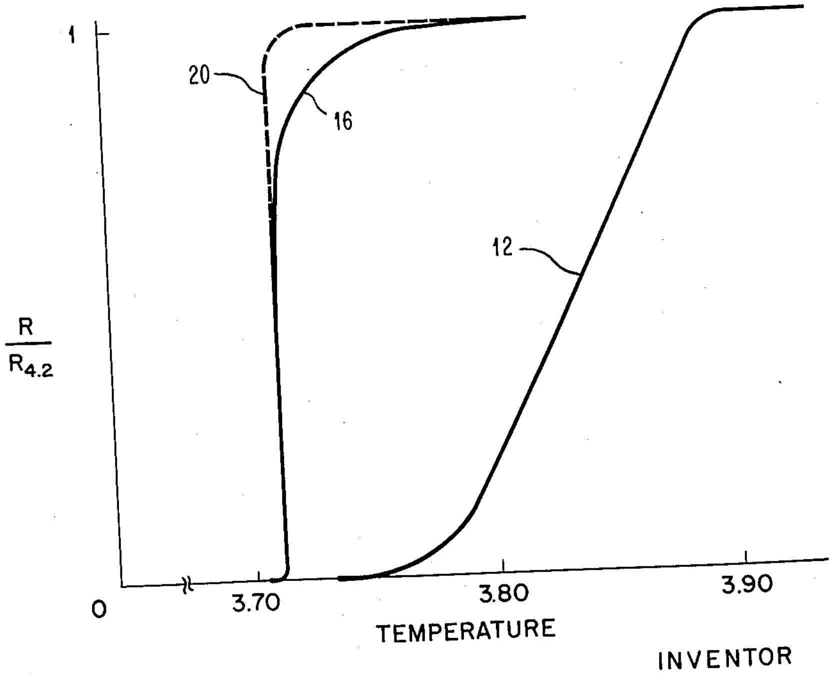
FIG. 2 illustrates the temperature transitions of thin film superconductive gate conductors carrying a second value of current.

Referring now to the drawings, curve 10 of FIG. 1 illustrates the temperature transition of a vacuum deposited thin film gate conductor carrying a measuring current of 0.1 milliampere. As there shown, as the temperature increases from 0° Kelvin, resistance begins to appear at a temperature of about 3.81° Kelvin and complete resistance is attained at a temperature of about 3.90° Kelvin. Referring now to curve 12 of FIG. 2 with the measuring current increased to a magnitude of one milliampere, resistance just begins to appear at a temperature of about 3.75° Kelvin and complete resistance is attained when the temperature is further increased to about 3.90° Kelvin. Further increases in the measuring current, causes the start of resistance to appear at a temperature of about 3.70° Kelvin, full resistance appearing again when the temperature reaches 3.90° Kelvin. It is thus seen that the temperature transition of vacuum deposited thin films is a function of the measuring current of the gate conductor. The dependence of the transition width between the superconducting and resistive conduction states as a function of the measuring current of the gate conductor, as shown by curves 10 and 12 (FIGS. 1 and 2), is due to the edge effect of the deposit film. As has been shown in U.S. Patent No. 2,989,716, the edges of a vacuum deposit film contain a relatively large concentration of impurities. These impurities, generally, impart a higher transition temperature to the edges of the deposited film, than the transition temperature exhibited by the superconductive material itself. Further, these impurities are distributed throughout the edges so that individual portions of the edges have independent transition temperatures depending solely on the impurity content therein. With low measuring currents, the current density through the edges of the deposited film, at a temperature which is above the normal transition temperature of the pure superconductor material, is insufficient, of and by itself, to cause a major portion of the edges to switch between conduction states. Thus, in curve 10, the temperature has to be increased by a relatively large amount as compared to the transition temperature of the center portion of the deposited film, which in this case is about 3.71° Kelvin, as more particularly described hereinafter. For this combination of temperature and current density, the temperature is ineffective to cause one or more portions of the edges to switch to the resistive state until the temperature is increased to 3.81° Kelvin. However, an increase in the gate current by a factor of 10 is effected to switch various portions of the edges to the resistive state at a significantly lower temperature, since the current density flowing in the edges has been correspondingly increased. Referring again to FIG. 1, curve 14 illustrates the improvement in the temperature transition of the thin film which yielded the transition of curve 10, after the impure edges have been removed by the etching operation described below. Curve 14 was obtained with the measuring current of 0.1 milliampere, the same value used to obtain curve 10 of FIG. 1. In a similar manner, curve 16 of FIG. 2 shows the temperature transition obtained with the measuring current of 1 milliampere, the same value employed in obtaining curve 12 after the edges have been removed. Finally, curve 18 of FIG. 1 and curve 20 of FIG. 2 illustrate the further improvement in the temperature transition at measuring currents of 0.1 and 1 milliampere, respectively, by annealing the previously etched film.

The method of the invention, as has been stated above, includes the following steps. First, the superconductive material is evaporated from a crucible, heated to a sufficiently high temperature within an evacuated chamber, then is directed through a pattern mask which defines the geometrical configuration of the gate conductor, onto a glass substrate. The evaporation of the material is continued, preferably at the highest rate possible to decrease the number of impurities adhering to the deposited film, until the deposited material attains a predetermined thickness, generally about a few thousand Angstrom units.

Since the apparatus required for vacuum deposition for thin films forms no part of the method of invention, it has neither been shown nor described, it being understood by those skilled in the art, that any of those commercially available may be so employed. By way of example, however, an apparatus particularly adapted to fabricate thin superconductor films during a single evaporation of the vacuum chamber is shown in copending application Serial No. 839,219, filed September 10, 1959, and now U.S. Patent No. 3,023,727, on behalf of N. Theodoseau et al., and assigned to the assignee of this invention.

The next step in the method, is to subject the deposited thin film gate conductor to an etching operation. This etching operation may be performed with a 0.1% glycerine solution of nitric and hydrochloric acids for approximately three minutes, which time is sufficient to remove the edges without appreciably removing the essentially homogeneous center portion of the film. Various other methods of etching the films may also be employed. These methods including, but not being limited to, various other chemical solutions, anodic etching, or electropolishing; each of these processes being well known in the art. This etching operation is effective to either completely remove the impure edges of the deposited film or, alternatively, for reasons not now completely understood but which appear to depend on the particular impurities concentrated in the edges, to leave a thin ribbon of material parallel to but electrically isolated from the center portion of the deposited film.

The final step in the method is to subject the etched film to an annealing operation. This annealing operation is effective to render the unetched portion of the film more homogeneous, since any impurities located in this portion are diffused therethrough, or desorbed therefrom resulting in a more constant concentration of impurities as a function of both the length and width of the film. It should be pointed out, however, that the annealing of impure films is generally ineffective to improve the transition characteristics of vacuum deposited films and, moreover, results in the transition characteristic being more effected by the self-current of the gate conductor. Experiments have shown that annealing of unetched films is effective to lower the temperature at which resistance first appears at low measuring currents and conversely to increase the temperature at which resistance first appears at high measuring currents. As has been stated above, the transitions at small measuring currents are predominantly determined by the characteristics of the film edges and the lowering of the initial transition temperature at small measuring currents indicates that the annealing of the unetched film removed some of the impurities in the edges. The removal of impurities from the edges in the annealed unetched film reduces the current carrying capacity thereof since the transition temperature of the edges approaches that of the pure material. The increase in the initial temperature transition occurring at higher measuring currents results from the large amount of impurities in the edges diffusing into the center portion of the film thereby raising the transition temperature thereof. Thus, when the current density is increased sufficiently so that the beginning of resistance appears at the transition temperature of the center portion of the film, the current density in the edges is effective to cause at least a portion of the edges of the annealed film to be resistive. This resistance does not appear until a temperature somewhat higher than the transition temperature of the pure superconductive material, since the impurities which were diffused into the center portion of the film from the edge portions during annealing are effective to raise the transition temperature of each portion thereof to a higher temperature than that of the unannealed film. Thus, it is mandatory prior to the annealing operation that the etching operation first be performed.

Referring again to FIGS. 1 and 2, it is seen that the initial transition temperature as obtained with a small measuring current is lowered much more after etching than when obtained with the large measuring current. This is in accordance with the above discussion wherein it was indicated that the concentration of impurities is greatest in the edges, the etching operation proceeds faster in material having the largest concentration of impurities, and the transitions obtained with small measuring currents are characteristic of the edges of the film. It is further seen in FIGS. 1 and 2 that the transition temperatures do not appreciably increase or decrease when the etched film is annealed as would be expected when an unetched film is annealed, depending on the magnitude of the measuring current respectively, as discussed above.

Figure 3:
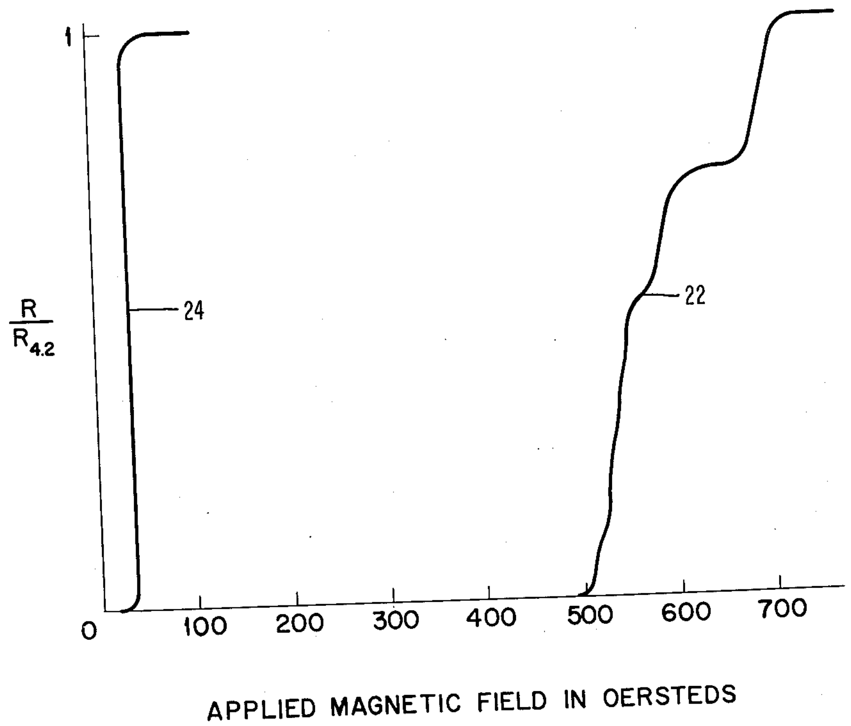
FIG. 3 illustrates the magnetic transitions of thin film superconductive gate conductors carrying the second value of current.

Referring now to FIG. 3, there is shown the corresponding improvement in the magnetic transitions of thin films afforded by the method of the invention. Each of the curves 22 and 24 shown therein were obtained with a measuring current of one milliampere, curve 22 representing the magnetic transition of a vacuum deposited thin film, and curve 24 indicating the improvement therein. Resistance begins to appear, in curve 22, only when the applied magnetic field is in excess of about 500 oersteds, and complete resistance is exhibited when the field exceeds 700 oersteds. This occurs because the edge portions are thinner than the center portion, thereby requiring a larger field value and also the impurity concentration in the edges raises their critical field value. With the edges removed however, resistance appears at a field of about 38 oersteds and is essentially complete when the applied field is increased only a few oersteds.

Further, the method of the invention is adaptable to form simple or complex superconductive circuits, of the type disclosed in the hereinbefore reference copending application Serial No. 625,512. In forming these circuits, a superconductive shield plane consisting of a hard superconductive material, that is, a material having a relatively high transition temperature, is vacuum deposited on an insulating substrate which may be, by way of example, glass. Next, an insulating material such as silicon monoxide is vacuum deposited upon the shield thereby insulating the shield from latter deposited circuit elements. The silicon monoxide layer is then saturated with a solution of a polymer or a wax and the excess solution is removed leaving only enough solution to protect the silicon monoxide, which would otherwise react with aqueous solutions. Next, a soft superconductive material, that is, a material having a relatively low transition temperature is deposited through a pattern mask which defines the geometric configuration required by the gate conductors of the superconductive circuits being fabricated. This superconductive layer being thereafter operable as the gate conductors. As before, the evaporation of the gate conductor material is performed at as high an evaporation rate as possible to lower the number of impurities adhering with the deposited gate conductor material. The etching and annealing operations of the invention are next successively performed in order, thereby obtaining in the gate conductors, the required abrupt transition between conduction states in the manner described above. After the etched solution has been thoroughly rinsed off, a hard superconductive material is deposited through a second pattern defined mask to interconnect selected ones of the gate conductors, as required. This step is then followed by a second evaporation of silico nmonoxide to completely insulate the gate conductor layer from further conductive layers. The next step in the process is to evaporate a hard superconductive material through a third pattern defining mask, this last layer being effective as the control conductors. Again, an insulating layer of silicon monoxide is deposited to protect the previously deposited circuitry and, finally, a second hard shield conductor is deposited as required. In the process of forming the superconductive circuits described above the etching and annealing steps according to the invention were not performed on the hard superconductive layers since the hard superconductive material is normally always maintained in the superconducting state, thus, the transition characteristics of the hard superconductive material is normally always maintained in the superconducting state, thus, the transition characteristics of the hard superconductive material do not influence the operation of a thin film superconductive circuit.

While the invention has been particularly shown and described with reference to a preferred embodiment thereof, it will be understood by those skilled in the art that various changes in form and details may be made therein without departing from the spirit and scope of the invention.

What is claimed is:

1. In the method of fabricating a thin film superconductive gate conductor having a relatively abrupt transition between the superconducting and resistive conduction states by forming a thin film of superconductive material upon a substrate within an evacuated chamber by thermally evaporating said material through a pattern masks which defines the geometry of said gate conductor, said thin film thereby including a center portion of first composition and a pair of edge portions of second composition; the improvement comprising subjecting said thin film to an etching operation, whereby said edge portions of second composition are substantially removed from said center portion.

2. The method of fabricating a thin film superconductive gate conductor having a relatively abrupt transition between the superconducting and resistive conduction states comprising the steps of forming a thin film of superconductive material upon a substrate within an evacuated chamber by thermally evaporating said material through a pattern mask which defines the geometry of said gate conductor; said thin film thereby including a center portion of first composition and a pair of edge portions of second composition; subjecting said thin film to an etching operation to thereby electrically remove said pair of edge portions of second composition from said center portion of first composition; and subjecting said center portion to an transition characteristic approaching that of the bulk su- annealing operation, whereby said thin film exhibits a perconductive material.

3. The method of forming a thin film superconductive gate conductor having relatively abrupt magnetic and temperature transitions between the superconducting and resistive conduction states comprising the steps of vacuum depositing a strip of superconductive material through a pattern mask onto a substrate within a vacuum chamber; said film thereby including a center portion having a relatively uniform composition and a pair of edge portions having a relatively non-uniform composition; and subjecting said deposited film to an acid etch effective to preferentially remove said pair of edge portions of non-uniform composition, whereby the transition characteristics of said deposited film are determined by the transition characteristics of said center portion.

4. The method of claim 3 wherein said superconductive material is tin.

5. The method of forming a thin film superconductive gate conductor having relatively abrupt magnetic and temperature transitions between the superconducing and resistive conduction states comprising the steps of vacuum depositing a strip of superconductive material through a pattern mask onto a substrate through a pattern mask; said film thereby including a center portion having a relatively uniform composition and a pair of edge portions having a relatively non-uniform composition; subjecting said deposited film to an acid etch effective to preferentially remove said pair of edge portions of non-uniform composition; and subjecting said center portion to an annealing operative effective to render the composition of said center portion more homogeneous, whereby the transition characteristics of said deposited film are determined by the transition characteristics of said center portion.

6. The method of fabricating a thin film superconductive circuit comprising the steps of vacuum depositing a hard superconductive material upon a substrate; vacuum depositing a first layer of insulating material upon said substrate; coating said first layer of insulating material with a material which is impervious to aqueous solutions; vacuum depositing a soft superconductive material upon said substrate through a first pattern mask which defines the geometric configuration of the gate conductor of said circuit; subjecting said deposited soft superconductive material to an etching operation to remove the edges of said gate conductor to ensure that said gate conductor exhibits essentially an abrupt transition characteristic between the superconducting and resistive conduction states; vacuum depositing a second layer of insulating material upon said substrate; and vacuum depositing a hard superconductive material through a second pattern mask which defines the geometric configuration of the control conductor of said superconductive circuit.

7. The method of fabricating a thin film superconductive circuit comprising the steps of vacuum depositing a hard superconductive material upon a substrate; vacuum depositing a first layer of insulating material upon said substrate; coating said first layer of insulating material with a material which is impervious to aqueous solutions; vacuum depositing a soft superconductive material upon said substrate through a first pattern mask which defines the geometric configuration of the gate conductor of said circuit; subjecting said deposited soft superconductive material to an etching operation to remove the edges of said gate conductor to ensure that said gate conductor exhibits essentially an abrupt transition characteristic between the superconducting and resistive conduction states; subjecting said gate conductor to an annealing operation; vacuum depositing a second layer of insulating material upon said substrate; and vacuum depositing a hard superconductive material through a second pattern mask which defines the geometric configuration of the control conductor of said superconductive circuit.

8. The method of fabricating a thin film superconductive circuit element having relatively abrupt and reproducible magnetic and temperature transitions between the superconductive and resistive conduction states when said element is operated at a superconductive temperature, which method comprises the steps of forming a thin film of superconductive material upon a substrate within an evacuated chamber by thermally evaporating said superconductive material through a pattern mask which defines the geometry of said superconductive circuit element; and thereafter subjecting said element to an etching operation to preferentially remove the lateral edge portions of said deposited configuration to electrically isolate said edges from the remaining portion of said geometric pattern of deposited superconductive material, said etching operation being effective only to improve the reproducibility of the electrical characteristics of said configuration without materially altering the geometric pattern thereof.

9. The method of fabricating a thin film superconductive circuit element having relatively abrupt and reproducible transitions between the superconductive and resistive conduction states when said element is operated at a superconductive temperature, which method comprises the steps of forming a thin film of superconductive material upon a substrate within an evacuated chamber by thermally evaporating said superconductive material through a pattern mask which defines the geometry of said superconductive circuit element; said thin film geometry determined by said pattern mask thereby including a center portion which exhibits a first relatively homogeneous electrical characteristic and a pair of edge portions which exhibit variations of electrical characteristics; thereafter subjecting said circuit element to an etching operation to preferentially remove the lateral edge portions of said deposited configuration to electrically isolate said edges from the center portion of said geometric pattern of superconductive material, said etching operation being effective only to improve the reproducibility of the electrical characteristics of said configuration without materially altering the geometric pattern thereof; said electrical characteristics thereby being determined by said center portion only; and subjecting said center portion to an annealing operation at a predetermined increased temperature for a time sufficient to further stabilize said electrical characteristics.

References Cited in the file of this patent

UNITED STATES PATENTS

| | | |
|---|---|---|
| 2,849,583 | Pritikin | Aug. 26, 1958 |
| 2,930,106 | Wrotnowski | Mar. 29, 1960 |
| 2,936,435 | Buck | May 10, 1960 |
| 2,946,030 | Slade | July 19, 1960 |
| 2,958,836 | McMahon | Nov. 1, 1960 |

OTHER REFERENCES

Buck: "Proc. of the IRE," April 1956, pages 482–493, page 486 relied on.

UNITED STATES PATENT OFFICE
CERTIFICATE OF CORRECTION

Patent No. 3,058,851 October 16, 1962

George J. Kahan

It is hereby certified that error appears in the above numbered patent requiring correction and that the said Letters Patent should read as corrected below.

Column 3, line 14, for "vacum" read -- vacuum --; column 6, line 65, for "silico nmonoxide" read -- silicon monoxide --; column 7, line 43, strike out "annealing operation, whereby said thin film exhibits a" and insert the same after "to an" in line 41, same column 7; column 7, line 64, for "superconducing" read -- superconducting --; line 74, for "operative" read -- operation --.

Signed and sealed this 22nd day of October 1963.

(SEAL)
Attest:

ERNEST W. SWIDER
Attesting Officer

EDWIN L. REYNOLDS
Acting Commissioner of Patents